(12) United States Patent
Garreau et al.

(10) Patent No.: US 9,201,109 B2
(45) Date of Patent: Dec. 1, 2015

(54) DEVICE AND METHOD FOR DETERMINING AT LEAST ONE VALUE ASSOCIATED WITH THE ELECTROMAGNETIC RADIATION OF AN OBJECT BEING TESTED

(75) Inventors: Philippe Garreau, Paris (FR); Per Iversen, Doylestown, PA (US); Arnaud Gandois, Breuillet (FR); Luc Duchesne, Angervilliers (FR)

(73) Assignee: Microwave Vision (FR)

( * ) Notice: Subject to any disclaimer, the term of this patent is extended or adjusted under 35 U.S.C. 154(b) by 424 days.

(21) Appl. No.: 12/735,876

(22) PCT Filed: Feb. 17, 2009

(86) PCT No.: PCT/EP2009/051861
§ 371 (c)(1),
(2), (4) Date: Aug. 20, 2010

(87) PCT Pub. No.: WO2009/103702
PCT Pub. Date: Aug. 27, 2009

(65) Prior Publication Data
US 2010/0320996 A1    Dec. 23, 2010

(30) Foreign Application Priority Data
Feb. 20, 2008  (FR) ...................... 08 51093

(51) Int. Cl.
*G01R 31/02* (2006.01)
*G01R 31/00* (2006.01)
*G01R 29/08* (2006.01)

(52) U.S. Cl.
CPC .......... *G01R 31/001* (2013.01); *G01R 29/0864* (2013.01)

(58) Field of Classification Search
CPC ............. G01R 31/001; G01R 29/0864; G01V 5/0008–5/0091
USPC ............. 324/72, 262, 501, 149; 378/197, 198
See application file for complete search history.

(56) References Cited

U.S. PATENT DOCUMENTS 3,281,598 A * 10/1966 Hollstein ...................... 378/179
4,003,261 A    1/1977 Nautet et al.
(Continued)

FOREIGN PATENT DOCUMENTS

FR    2313682 A1    12/1976
FR    2858855 A1     2/2005
(Continued)

OTHER PUBLICATIONS

International Search Report and Written Opinion, PCT/EP2009/051861, dated Aug. 10, 2009.
(Continued)

*Primary Examiner* — Patrick Assouad
*Assistant Examiner* — Demetrius Pretlow
(74) *Attorney, Agent, or Firm* — Lerner, David, Littenberg, Krumholz & Mentlik, LLP

(57) ABSTRACT

The invention relates to a device (10) for determining at least one characteristic of the electromagnetic radiation of an object being tested, and to a probe network (100), characterized in that it comprises a means (200) for sliding said probe network (100) on itself with a relative offset between the probe network (100) and the object being tested, that is higher than the pitch of the probe network (100) in order to carry out measurements along a plurality of relative positions of the probe network (100) and the object being tested, and to access specific regions of the object being tested; means are provided for positioning, adjusting and aligning the probe network (100) relative to the object being tested in order to move towards/come to/fit onto the object being tested, and means are provided for the mechanical scanning of the probe network around or in front of the object being tested in order to carry out measurements along spherical, cylindrical or planar shapes.

3 Claims, 1 Drawing Sheet

(56) References Cited

U.S. PATENT DOCUMENTS

| | | | | |
|---|---|---|---|---|
| 4,802,197 | A * | 1/1989 | Juergens | 378/197 |
| 4,968,983 | A * | 11/1990 | Maeda | 343/703 |
| 5,014,293 | A * | 5/1991 | Boyd et al. | 378/197 |
| 5,365,241 | A | 11/1994 | Williams et al. | |
| 5,532,704 | A * | 7/1996 | Ruelle | 343/703 |
| 5,692,028 | A * | 11/1997 | Geus et al. | 378/57 |
| 6,329,953 | B1 * | 12/2001 | McKivergan | 343/703 |
| 6,850,851 | B1 * | 2/2005 | Fourestie et al. | 702/65 |
| 6,925,145 | B2 * | 8/2005 | Batzinger et al. | 378/59 |
| 7,035,594 | B2 * | 4/2006 | Wallace et al. | 455/67.12 |
| 7,443,170 | B2 * | 10/2008 | Garreau et al. | 324/501 |
| 7,466,142 | B2 * | 12/2008 | Garreau et al. | 324/628 |
| 7,594,448 | B2 * | 9/2009 | Jacobson et al. | 73/865.8 |
| 7,734,008 | B1 * | 6/2010 | Sanders et al. | 378/57 |
| 2004/0202285 | A1 * | 10/2004 | Masini | 378/197 |
| 2006/0078091 | A1 | 4/2006 | Lasiuk et al. | |
| 2006/0103403 | A1 | 5/2006 | Strid et al. | |
| 2006/0208746 | A1 * | 9/2006 | Garreau et al. | 324/627 |
| 2006/0267848 | A1 * | 11/2006 | Nagashima | 343/703 |

FOREIGN PATENT DOCUMENTS

| | | |
|---|---|---|
| JP | 02095910 U | 7/1990 |
| JP | 05133989 | 5/1993 |
| JP | 10062467 | 3/1998 |
| JP | 2004077336 A | 3/2004 |
| RU | 2014624 C1 | 6/1994 |

OTHER PUBLICATIONS

Altman Z et al: "Spherical Near Field Facility for Characterizing Random Emissions" IEEE Transactions on Antennas and Propagation, IEEE Service Center, Piscataway, NJ, US, vol. 53, No. 8, Aug. 1, 2005, pp. 2582-2589, XP011137410.

* cited by examiner

DEVICE AND METHOD FOR DETERMINING AT LEAST ONE VALUE ASSOCIATED WITH THE ELECTROMAGNETIC RADIATION OF AN OBJECT BEING TESTED

The invention relates to devices and methods for determining at least one value associated with the electromagnetic radiation of an object being tested.

For determining the radiation diagram of an object being tested it has already been proposed to use devices which are in the form of a probe network distributed over a circular arch, a portion of arch, a sphere, a portion of sphere (spherical dome) or a portion of a cylinder (cylindrical dome) placed about the object being tested to be studied or on a line or a plane placed in front of the object being tested to be studied. Devices of this type are known, which comprise means enabling the probe arch, the arch portion, the sphere or the portion of sphere and the object being tested to turn relative to one another about an axis which corresponds to a diameter of the arch or of the sphere so as to measure the radiation of the object being tested in successive planes distributed about the relative axis of rotation of the arch or of the sphere and of the object being tested, that is, on a sphere or a portion of sphere surrounding the object.

It is also known to use probe networks in arch, portion of arch or portion of a cylinder by relatively moving the object being tested perpendicularly relative to the plane of the probe network so as to measure radiation on a cylinder or a portion of a cylinder surrounding the object.

It is also known to make use of online probe networks by relatively turning the object being tested about an axis parallel to the probe network so as to measure radiation on a cylinder surrounding the object.

It is also known make use of online or plane probe networks by relatively shifting the object being tested on a plane parallel to the probe network so as to measure radiation on a plane in front of the object.

Yet whether used for measurements in spherical coordinates, measurements in cylindrical coordinates or measurements in Cartesian coordinates, these probe network devices in arch, sphere, line or plane have limitations associated with the slotted measuring pitch imposed by the arrangement of probes in a network.

In fact, the number of measuring points necessary for measuring an antenna at a given frequency is directly linked to the size of the radiating source and to the wavelength at the measuring frequency ($\lambda$). For example, for measurements in spherical or cylindrical geometry, there are different sampling criteria for determining the number of necessary measuring points along the arch, the portion of arch, on the sphere, the portion of sphere or the portion of a cylinder.

The best known is given by the minimum distance equal to $\lambda/2$ between the sampling points on the minimum sphere surrounding the source, a minimum sphere of diameter D and whereof the centre coincides with the centre of the network. This corresponds to angular spacing between the measuring probes of the network equal to $\lambda/D$. The same applies to measurements in planar geometry, and the criterion sampling is given by the minimum distance equal to $\lambda/2$ between the sampling points on a plane in front of the source. This corresponds to spacing between the measuring probes of the network equal to $\lambda/2$.

Using a probe network of which the size, number and spacing of measuring probes are physically limited imposes either, for a given frequency, restrictions on the dimensions of the object being tested the field of which is to be measured, or, for given dimensions of the object being tested, restrictions on the maximal measuring frequency possible. To eliminate these disadvantages, a device has been proposed within the scope of measurements in spherical and cylindrical geometries comprising means enabling relative rocking of the probe network and/or of the object being tested to angularly offset the probe network of the object being tested relative to one another and thus take measurements according to several relative angular positions offset by a fraction of pitch of the probe network and of the object being tested.

In this way, the number of measuring points is multiplied for each relative position of the probe network and of the object being tested.

Consequently, this increases the maximal possible measuring frequency for given dimensions of the object to be measured. The same applies to a given measuring frequency, allowing an increase of the dimensions of the object being tested within the scope of measurements in spherical and cylindrical geometries.

An example of this is described for example in application FR 2 858 855 which provides offsets allowing sampling with a pitch less than the pitch of the probe network.

However, this type of device still remains poorly adapted for large-size objects to the extent where it requires probe networks and/or measuring installations whereof the dimensions must be adapted to those of these objects.

Otherwise, it does not offer the possibility of specifically selecting the geometric zones of an object being tested where the aim is to take radiation measurements.

Besides, RU 2 014 624 discloses a system comprising a single probe (and not a probe network) which is shifted by a guide in an arc of a circle.

An aim of the invention is to eliminate the disadvantages of earlier systems.

Another aim of the invention is to widen the field of use of a given probe network especially in terms of object size whereof the radiation diagram can be determined, while at the same time keeping an indefinite sampling capacity. Another aim of the invention is to propose a mobile measuring device, which is compact and economic and capable of being precisely transported to geometric zones of an object where the aim is to take radiation measurements. A last aim of the present invention is to propose a device for measuring the radiation of objects of considerable dimensions at higher frequencies and with a smaller number of probes.

These aims are attained according to the invention by means of a device for determining at least one characteristic of the electromagnetic radiation of an object being tested, and to a probe network, characterised in that it comprises means for allowing the probe network to slide on itself with a relative offset of the probe network and of the object being tested that is higher than the pitch of the probe network in order to carry out measurements along a plurality of relative positions of the probe network and of the object being tested.

Other characteristics, aims and advantages of the invention will emerge from the following detailed description which is purely illustrative and non-limiting and must be read with respect to the attached diagram, in which.

Figure 1:
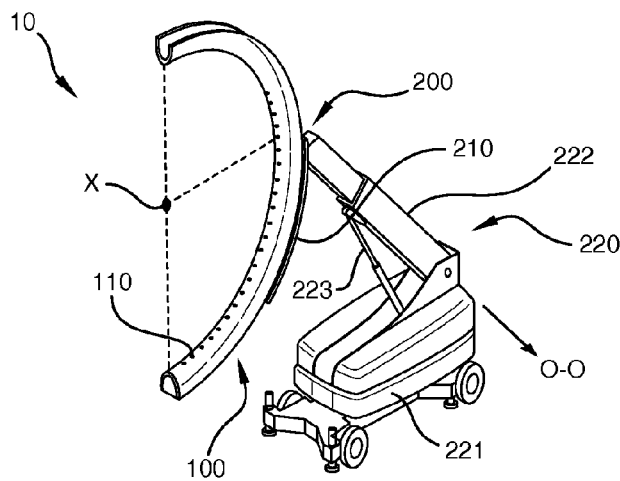
FIG. 1 illustrates a measuring device according to an embodiment of the invention.
Figure 2:
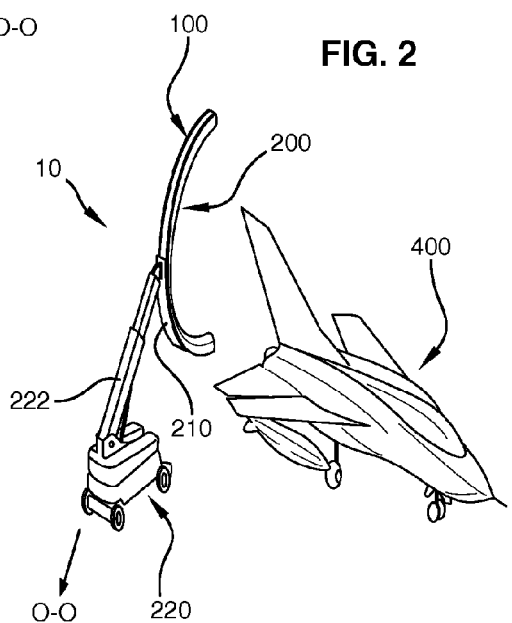
FIGS. 2 and 3 illustrate the device of FIG. 1 used for testing an aircraft.
Figure 3:
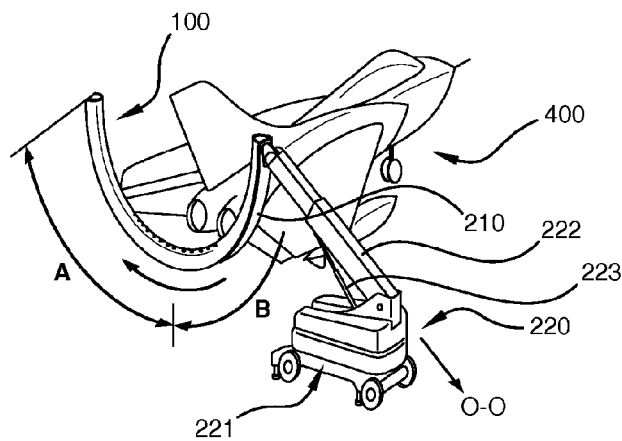

FIGS. 1 to 3 illustrate a measuring device 10 according to the invention mainly comprising a network of measuring antennae 100 distributed over a arch 110 mounted on a sliding system 200 for determining the radiation diagram of an object 400 being tested.

This device 10 defines a concept of an eye or microwave vision for which the measuring means 100 are taken to precise zones of the object 400 being tested where the aim is to know the electromagnetic behaviour and large-size objects 400 being tested are measured.

1. Measuring-Antennae Arch

FIGS. 1 to 3 illustrate an arch 110 in the form of a semi-circle.

This arch 110 comprises a network of electromagnetic probes 100 (or network of measuring antennae) illustrated schematically by dots.

It should be noted that a network 100 is defined as a series of n measuring antennae, n being greater than or equal to 2.

In the same arch 110 this network 100 preferably combines two series or more of electromagnetic probes nested or not, and functioning on different frequency bands for widening the operating band of the measuring device 10.

A non-limiting example here is a network 100 combining two series of electromagnetic probes so as to take measurements covering the frequency band 0.4 GHz to 18 GHz. As per the variant embodiments, the network 100 can comprise either a succession of two series or more of electromagnetic probes, or regular alternation or not of these two series of electromagnetic probes along the arch 110.

The different series of probes can be considered as sub-networks.

2. Sliding System of the Network of Electromagnetic Probes

A sliding system 200 is also provided comprising means 210 to enable sliding of the arch 110 supporting the network of electromagnetic probes 100 in the plane of the network 100 about its geometric centre, a centre evidenced in FIG. 1 by a cross.

These sliding means 210 are advantageously selected to angularly offset the probe network 100 of the object 400 being tested relative to one another. For example, the arch 110 of the network of electromagnetic probes 100 can be moved angularly by scanning more than a semi-circle surrounding the object 400 being tested, as illustrated in FIG. 3.

These sliding means 210 are illustrated in FIGS. 1 to 3 by an arm 210 in the form of an arc of a circle to be placed in the plane of the network 100, about the object 400 being tested.

This arm 210 comprises means suitable for receiving and fixing in an adjustable position along the latter, with the arch 110 supporting the network of electromagnetic probes 100.

In this way it has an inner concave surface on which a convex surface complementary to the arch 110 is supported and slides, by appropriate means such as a hydraulic film, a ball roller or other.

In a variant embodiment, the inner surface of the arm 210 can exhibit guide grooves for enabling sliding of the arch along the arm 210 to the preferred position.

Other sliding means are also possible. In addition, electric motorisation, by appropriate means such as a rack system, an endless screw system, a toothed belt system or other can be provided to angularly move the arch 110 along the arm 210.

Also, the sliding system 200 has means 220 allowing it to easily shift the arm 210 associated with the arch 110 of the network of electromagnetic probes 100 in all directions relative to the object 400 being tested. The arm 210 is preferably connected by a telescopic mast 222 to a support 221 mounted on wheels, rails or air cushions, resulting in a mobile device 10.

More precisely, and by extending or retracting, this telescopic mast 222 can move the network of electromagnetic probes 100 mounted on the arm 210 by way of a jack 223 so that it is adjusted to a determined height. It has several extension sections adapted to creating an adequate track allowing the zone of the object 400 being tested to be studied to be placed at the geometric centre of the probe network 110.

In addition, this mast 222 can comprise means adapted to allow rotation of the arm 210 about its longitudinal axis O-O. Also, additional means comprising rotations and translations of the arm 210 can be employed prior to measuring so as to precisely place, adjust and align the measuring device 10 relative to the object 400 being tested. During the measuring sequence, some of these means or other additional means can serve to execute scanning according to spherical or cylindrical geometry with the arch 110 supporting the probe network 100 about the particular zones to be measured.

The measuring device 10 is advantageously mobile and transportable to the object 400 being tested and more precisely to the particular zones of the object 400 being tested where radiation study is to be conducted.

3. Support of the Object being Tested

A support (not illustrated) for the object 400 being tested can also be provided. This support can integrate means of rotation and translation for placing and adjusting the object being tested in the zone test if necessary.

In most cases, this support is not necessary as it is the measuring system 10 which adapts to the object 400 being tested and no longer the object 400 being tested which must adapt to the measuring means, as is the conventional case in the prior art of measuring antennae.

4. Mechanical Sliding Movement

Concerning the mechanical slide movement of the arch 110 supporting the network of electromagnetic probes 100 on the arm 210, in a radiation-measuring plane, that is, for each relative position of the arm 210 relative to the object 400 being tested the latter advantageously multiplies the radiation measuring points but also enlarges the covered geometric measuring zone of the object 400 being tested.

In fact, following sliding of the arch 110 supporting the network of electromagnetic probes 100 on the arm 210 from an initial position to a final position along the arm 210 as illustrated successively in FIGS. 2 and 3, two zones are evident: a zone A where the displacement of the arch 110 will acquire measurements in a geometric zone of the object 400 being tested different to that previously subjected to measurements and a zone B where displacement of the arch 110 will allow oversampling of measurements taken.

Of course, oversampling can also be done in the zone A. In the zone B, the slide movement of the arch 110 on the arm 210 angularly offsets the network of electromagnetic probes 100 relative to the object 400 being tested and scans several relative positions of the probe network 100 relative to the object 400 being tested. So for each radiation-measuring plane it is possible to effect several series of consecutive measuring points corresponding to the different relative angular offsets of the probe network 100 relative to the object 400 being tested.

According to the slide movements made, these relative angular offsets of the network of electromagnetic probes 100 and of the object 400 being tested are greater than the angular pitch of the probe network 100.

The slide movements of the arch 110 in the plane of the network 100 thus help multiply the points of electromagnetic measurements about the object 400 being tested and carry out increased angular sampling with a probe network 100 of given pitch. Also, in the zone A, the slide movement of the arch 110 supporting the network of electromagnetic probes 100 on the arm 210 carries out mapping of measuring points corresponding to relative angular offset of the probe network 100 relative to the object 400 being tested and not yet completed during the preceding angular positioning of the arch 110 relative to the object 400 being tested.

In a radiation-measuring plane the slide movement of the arch 110 covers a geometric zone of the object 400 being tested different to that previously studied prior to sliding of the arch 110.

Therefore, the means allowing the sliding of the arch 110 supporting the network of electromagnetic probes 100 are suitable for taking measurements according to relative angular several positions of the probe network 100 and of the object 400 being tested over an angular distance greater than the angular distance over which the probe network 100 extends.

Consequently, an arch 110 supporting a network of electromagnetic probes 100 associated with means allowing its sliding has an advantage for objects of considerable size for which the construction of an arch and/or of an anechoic chamber of size adapted to the dimensions of the object is no longer necessary.

Another advantage is to have access with the probe network 100 to geometric zones of the object 400 being tested naturally difficult to access, for example in FIGS. 2 and 3 the tail, the nose or under the fuselage of the aircraft.

5. Other Geometries a. Linear and Planar Networks

A variant embodiment proposes a probe network no longer distributed over an arch in the form of an arc of a circle but on a linear support.

A sliding system 200 is therefore provided comprising means 210 for enabling linear sliding of the network of electromagnetic probes 100 according to the direction parallel to that of the probe network.

These sliding means 210 are advantageously selected to offset the probe network 100 and the object 400 being tested relative to one another with offset greater than the pitch of the probe network 100 and for enabling measurements according to several relative positions of the probe network 100 and of the object 400 being tested.

These sliding means 210 can take the form of a rectilinear arm 210, said arm comprising means for receiving and fixing the linear network of electromagnetic probes 100 in an adjustable position along the latter.

In this way it presents an inner rectilinear surface on which a complementary surface of the support linear of the network of electromagnetic probes 100 is supported and slides, by appropriate means.

Similarly to the case of the network of electromagnetic probes 100 distributed over an arch in the form of an arc of a circle, the linear mechanical sliding movement of the network of electromagnetic probes 100 on the arm 210 advantageously multiplies the radiation-measuring points in a radiation-measuring plane, but also enlarges the covered geometric measuring zone of the object 400 being tested.

Similarly to the case of the network of electromagnetic probes 100 distributed over an arch in the form of an arc of a circle, an assembly of means comprising rotations and translations of the arm 210 can be used prior to measuring so as to precisely position, adjust and align the measuring device 10 relative to the object 400 being tested. During the measuring sequence, some of these means or other additional means can serve to carry out scanning according to planar or cylindrical geometry with the arch 110 supporting the probe network 100 in front of or around particular zones to be measured. Another variant embodiment provides a probe network 100 distributed over a support plane.

The sliding means 210 take the form of two perpendicular rectilinear arms, each of the arms comprising means suitable for receiving and fixing the network of electromagnetic probes 100 in an adjustable position along the latter.

The sliding means 210 thus move the probe network 100 in both perpendicular directions forming the plane.

b. Spherical and Cylindrical Networks

In another variant embodiment, the probe network 100 can be distributed over a support in the form of a spherical or cylindrical dome.

A sliding system 200 comprising means enabling sliding of the dome supporting the network of electromagnetic probes 100 is provided so as to enable measurements of fields in spherical or cylindrical coordinates.

These sliding means 210 can take the form of two arms in the form of an arc of a circle for the spherical dome and of an arm in the form of an arch of a circle associated with a linear arm for the cylindrical dome, the two arms comprising means suitable for receiving and fixing the dome of the network of electromagnetic probes 100 in an adjustable position along the latter.

These two arms are placed so as to allow two perpendicular shifts of the dome of the network of electromagnetic probes 100 to take measurements of fields on a sphere or a cylinder surrounding the object 400. In conclusion, the expert will appreciate a measuring device 10 allowing multiplication of measuring points made relative to the probe network 100 used, but also a larger geometric measuring zone of the object 400 being tested studied relative to the probe network 100 used and, consequently, the opportunity to be able to determine the radiation diagram of objects being tested 400 without restrictions on their dimensions, and also to be able to access particular geometric zones of the object being tested and at times naturally difficult to access during measurements with the probe network 100.

A set of rotation and translation means of the arm 210 further positions, adjusts and aligns the measuring device 10 relative to the object 400 being tested. During the measuring sequence, some of these means or other additional means can serve to execute scanning according to spherical, cylindrical or planar geometry with the arch 110 supporting the probe network 100 in front of or around particular zones to be measured.

The characteristics of the measuring means 10 described hereinabove correspond to the concept "of the microwave eye" allowing going towards/coming to/fitting onto the object 400 being tested by way of measure 10.

The invention claimed is:

1. A measuring device for determining an electromagnetic radiation diagram of an object being tested emitting an electromagnetic radiation, the device comprising:

a network of more than two radiation-measuring antennae each able to measure the electromagnetic radiation, wherein the network of more than two radiation-measuring antennae is distributed with an angular pitch having a given value between the antennae over a same mobile arch in the form of an arc of a circle mounted on an arm in the form of an arc of a circle placed in a plane of the network; and a sliding system allowing sliding of the mobile arch along an inner concave surface of the arm to carry out mapping of radiation-measuring points over a first angular distance that is greater than a second angular distance over which the network of more than two radiation-measuring antennae extends on the mobile arch for determining the radiation diagram of the object being tested, wherein the sliding system is provided for allowing the sliding of the mobile arch relative to the arm with a relative offset of the network of more than two radiation-measuring antennae relative to the object being tested, which is higher than the given angular pitch of the network of more than two radiation-measuring antennae.

2. The device as claimed in claim 1, wherein the arm is connected by a telescopic mast to a support mounted on wheels, rails or air cushions, resulting in a mobile device.

3. A method for determining an electromagnetic radiation diagram of an object being tested emitting an electromagnetic radiation, using a measuring device comprising a network of more than two radiation-measuring antennae each able to measure the electromagnetic radiation, wherein the network of more than two radiation-measuring antennae is distributed with an angular pitch having a given value between them over a same mobile arch in the form of an arc of a circle mounted on an arm in the form of an arc of a circle placed in a plane of the network, wherein the method comprises at least one step of sliding the mobile arch along an inner concave surface of the arm to carry out mapping of radiation-measuring points over a first angular distance that is greater than a second angular distance over which the network of more than two radiation-measuring antennae extends on the mobile arch for determining the radiation diagram of the object being tested, wherein the step of sliding is provided for allowing sliding of the arch relative to the arm with a relative offset of the network of more than two radiation-measuring antennae relative to the object being tested, which is higher than the given angular pitch of the network of more than two radiation-measuring antennae.

* * * * *